(12) United States Patent
Min

(10) Patent No.: US 8,975,731 B2
(45) Date of Patent: Mar. 10, 2015

(54) SEMICONDUCTOR DEVICE HAVING AN INSULATING LAYER STRUCTURE AND METHOD OF MANUFACTURING THE SAME

(71) Applicant: Chung-Ki Min, Pyeongtaek-si (KR)

(72) Inventor: Chung-Ki Min, Pyeongtaek-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/106,095

(22) Filed: Dec. 13, 2013

(65) Prior Publication Data

US 2014/0239460 A1 Aug. 28, 2014

(30) Foreign Application Priority Data

Feb. 25, 2013 (KR) .................. 10-2013-0019759

(51) Int. Cl.
| | | |
|---|---|---|
| *H01L 21/3105* | (2006.01) | |
| *H01L 21/311* | (2006.01) | |
| *H01L 27/108* | (2006.01) | |
| *H01L 27/115* | (2006.01) | |

(52) U.S. Cl.
CPC .... *H01L 21/31051* (2013.01); *H01L 21/31056* (2013.01); *H01L 21/31144* (2013.01); *H01L 27/10894* (2013.01); *H01L 27/11548* (2013.01); *H01L 27/11556* (2013.01); *H01L 27/11575* (2013.01); *H01L 27/11582* (2013.01)
USPC .......................................... 257/623; 438/694

(58) Field of Classification Search
CPC ................................................. H01I 29/0657
USPC .......................................... 257/623; 438/694
See application file for complete search history.

(56) References Cited

U.S. PATENT DOCUMENTS

| | | | |
|---|---|---|---|
| 8,592,315 B2 * | 11/2013 | Kim et al. ................ | 438/692 |
| 2004/0053463 A1 | 3/2004 | Matsumura | |
| 2005/0014330 A1 | 1/2005 | Park et al. | |
| 2013/0277799 A1 * | 10/2013 | Chen et al. ................ | 257/532 |

FOREIGN PATENT DOCUMENTS

| | | |
|---|---|---|
| JP | 07-086284 | 3/1995 |
| KR | 1020050118959 A | 12/2005 |
| KR | 1020060009425 A | 1/2006 |
| KR | 1020060020189 A | 3/2006 |
| KR | 1020060030432 A | 4/2006 |
| KR | 1020060075402 A | 7/2006 |
| KR | 1020070056672 A | 6/2007 |
| KR | 1020090124122 A | 12/2009 |

* cited by examiner

*Primary Examiner* — Marc Armand
(74) *Attorney, Agent, or Firm* — Myers Bigel Sibley & Sajovec, P.A.

(57) ABSTRACT

In a semiconductor device having an insulating layer structure and method of manufacturing the same, a substrate including a first region and a second region may be provided. A first pattern structure may be formed on the first region of the substrate. A second pattern structure may be formed on the second region of the substrate, and have a height that is greater than the height of the first pattern structure. An insulating layer structure is formed on the first and second pattern structures and includes a protrusion near an area at which the first and second regions meet each other. An upper surface of the insulating interlayer structure is higher than a top surface of the second pattern structure. The protrusion may have at least one side surface having a staircase shape. A planarized insulating interlayer may be formed without substantial damage to the infrastructure by using the insulating layer structure in accordance with example embodiments.

12 Claims, 11 Drawing Sheets

FIRST REGION | SECOND REGION

FIRST REGION | SECOND REGION

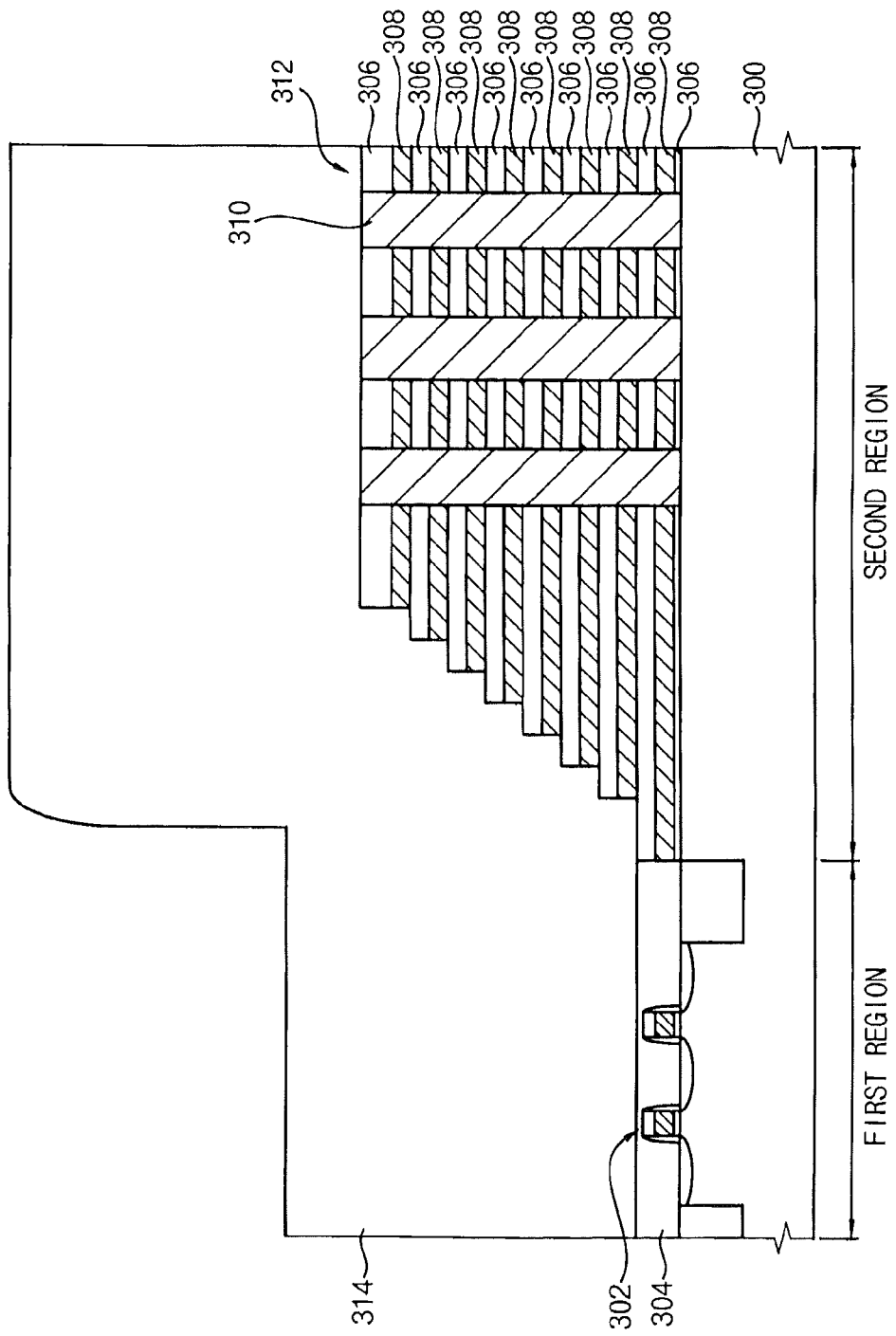

SEMICONDUCTOR DEVICE HAVING AN INSULATING LAYER STRUCTURE AND METHOD OF MANUFACTURING THE SAME

CROSS-REFERENCE TO RELATED APPLICATION

This application claims priority under 35 USC §119 to Korean Patent Application No. 10-2013-0019759 filed on Feb. 25, 2013 in the Korean Intellectual Property Office (KIPO), the disclosure of which is incorporated herein by reference in its entirety.

FIELD

Example embodiments relate to semiconductor devices including an insulating layer structure and methods of manufacturing the same.

BACKGROUND

In order to increase the integration degree of semiconductor devices, the height of pattern structures in the semiconductor device have been increased. A planarization process can be performed to reduce the height difference between the pattern structures. However, planarization can introduce defects, such as cracks, in the layer being planarized.

SUMMARY

Example embodiments provide a semiconductor device including an insulating layer structure which is suitable for a planarization process.

Example embodiments provide a method of manufacturing the semiconductor device including the insulating layer structure.

According to example embodiments, there is provided a semiconductor device including a substrate, a first pattern structure, a second pattern structure and an insulating layer structure. The substrate may include a first region and a second region. The first pattern structure may be formed on the first region of the substrate. The second pattern structure may be formed on the second region of the substrate, and may have a height that is greater than that of the first pattern structure. An insulating layer structure may be formed to cover the first and second pattern structures and may include a protrusion near an area at which the first and second regions meet each other, with an upper surface of the insulating layer structure being higher than a top surface of the second pattern structure. The protrusion may have a least one side surface having a staircase shape.

In example embodiments, the protrusion may include first and second side surfaces in the first and second regions, respectively, and a first horizontal distance from a bottom edge of the first side surface of the protrusion to a top edge thereof may be shorter than a second horizontal distance from a bottom edge of the second side surface to a top edge thereof.

In example embodiments, the second side surface of the protrusion may have a staircase shape and the second side surface of the protrusion includes at least two stairs.

In example embodiments, a ratio of a height with respect to a width of the protrusion may be in a range of about 1/10 to about 1/2.

In example embodiments, the upper surface of the insulating layer except for the protrusion may be flat and substantially have a constant height.

According to other example embodiments, there is provided a method of manufacturing a semiconductor device. In the method, a first pattern structure may be formed on a first region of a substrate. A second pattern structure may be formed on a second region of the substrate, and the second pattern structure may have a height higher than that of the first pattern structure. A first insulating layer may be formed to cover the first and second pattern structure and have an upper surface being higher than that of a top surface of the second pattern structure. A first photoresist pattern may be formed on the first insulating layer, and the first photoresist pattern may expose a portion of the first insulating layer in the second region of the substrate. The exposed portion of the first insulating layer may be partially etched using the first photoresist pattern as an etching mask to form a second insulation layer of a staircase shape. An end potion of the first photoresist pattern in the second region may be trimmed to form a second photoresist pattern exposing a portion of the second insulating layer previously covered by the first photoresist pattern. The exposed portion of the second insulating layer may be partially etched using the second photoresist pattern as an etching mask to form an insulating layer structure near an area at which the first and second regions meet each other, and the insulating layer structure may be formed to include a protrusion of which a side surface has a staircase shape.

In example embodiments, the insulating layer structure except for the protrusion may be formed to have an upper surface that is flat and has a constant height.

In example embodiments, a ratio of a height with respect to a width of the protrusion may be in a range of about 1/10 to about 1/2.

In example embodiments, an edge of the second photoresist pattern may be formed to be located in the second region of the substrate.

In example embodiments, after partially etching the exposed portion of the second insulating layer using the second photoresist pattern as the etching mask, i) an end portion of the second photoresist pattern may be trimmed to form a third photoresist pattern, ii) the exposed portion of the second insulating layer may be partially etched using the third photoresist pattern as an etching mask, and iii) the i) and ii) steps may be repeatedly performed at least once to form the insulating layer structure.

In example embodiments, the insulating layer structure may include silicon oxide.

In example embodiments, after forming the insulating layer structure, a chemical mechanical polishing process may be further performed to remove the protrusion from the insulating layer structure.

In example embodiments, the protrusion of the insulating layer structure may include first and second side surfaces adjacent to the first and second regions, respectively, and a first horizontal distance from a bottom edge of the first side surface of the protrusion to a top edge thereof may be shorter than a second horizontal distance from a bottom edge of the second side surface to a top edge thereof.

BRIEF DESCRIPTION OF THE DRAWINGS

Example embodiments will be more clearly understood from the following detailed description taken in conjunction with the accompanying drawings. FIGS. 1-17 represent non-limiting, example embodiments as described herein.

FIG. 1 is a cross-sectional view illustrating a semiconductor device in accordance with example embodiments;

FIGS. 2 to 7 are cross-sectional views illustrating methods of manufacturing a semiconductor device in FIG. 1;

FIG. 8 is a cross-sectional view illustrating a semiconductor device in accordance with example embodiments;

FIGS. 9 to 11 are cross-sectional views illustrating methods of manufacturing a semiconductor device in FIG. 8;

FIG. 12 is a cross-sectional view illustrating a semiconductor device in accordance with example embodiments;

FIGS. 13 and 14 are cross-sectional views illustrating an insulating layer structure of a semiconductor device in FIG. 12;

FIG. 15 is a cross-sectional view illustrating an insulating layer structure of a semiconductor device in accordance with example embodiments; and FIGS. 16 and 17 are cross-sectional view illustrating methods of manufacturing an insulating layer structure of a semiconductor device in accordance with example embodiments.

DETAILED DESCRIPTION

Figure 1:
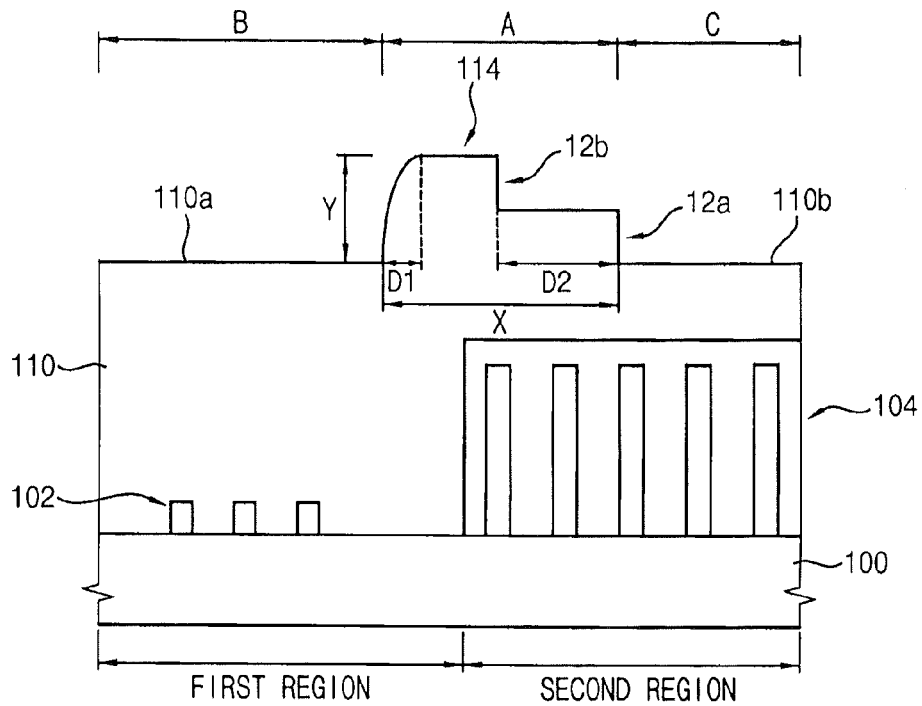

Example embodiments will now be described more fully with reference to the accompanying drawings, in which example embodiments are shown. Example embodiments may, however, be embodied in many different forms and should not be construed as limited to the example embodiments set forth herein. In the drawings, the thicknesses of layers and regions are exaggerated for clarity. Like reference numerals in the drawings denote like elements, and thus their description will be omitted.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms first, second, third, etc. may be used herein to describe various elements, components, regions, layers and/or sections, these elements, components, regions, layers and/or sections should not be limited by these terms. Unless indicated otherwise, these terms are only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

FIG. 1 is a cross-sectional view illustrating a semiconductor device in accordance with example embodiments.

Referring to FIG. 1, a substrate 100 may include a first region and a second region. The substrate 100 may be a single crystalline silicon substrate, however, the substrate may include other materials.

At least one first pattern structure 102 may be formed on the first region of the substrate 100. At least one second pattern structure 104 may be formed on the second region of the substrate 100. The first pattern structure 102 on the first region of the substrate 100 may have a height that is lower than the height of the second pattern structure 104 on the second region of the substrate 100. Therefore, there is a height difference between the first pattern structure 102 and the second pattern structure 104. In example embodiments, the first region may serve as a peripheral region, and the second region may serve as a cell region of the semiconductor device.

An insulating layer structure 110 may be formed on the substrate 100, and cover the first and second pattern structures 102 and 104. The insulating layer structure 110 may include, e.g., silicon oxide. In example embodiments, an upper surface of the insulating layer structure 110 may be higher than a top surface of the second pattern structure 104.

A portion of the insulating layer structure 110 near an area at which the first and second regions meet each other may be referred to as a first portion A. That is, the first portion A of the insulating layer structure 110 may be adjacent to both edges of the first and second regions that meet each other. A portion of the insulating layer structure 110 on the first region of the substrate 100 except for the first portion A may be referred to as a second portion B, and a portion of the insulating layer structure 110 on the second region of the substrate 100 except for the first region A may be referred to as a third portion C. Thus, the first portion A may be interposed between the second and third portions B and C.

Upper surfaces of the second and third portions B and C of the insulating layer structure 110 may be flat. In example embodiments, the upper surfaces of the second and third portions B and C of the insulating layer structure 110 may be substantially coplanar with each other.

The first portion A may protrude from the second and third portions B and C, that is, the first portion A of the insulating layer structure 110 may have a protrusion 114 that protrudes above the upper surfaces of the second and third portions B and C.

A ratio of a height Y with respect to a width X of the protrusion 114 may be equal to or less than about ½, preferably, in a range of about 1/10 to about ½.

If the width X of the protrusion 114 is reduced to deviate from the above range, a microtrench may be formed near the bending edge of the protrusion 114 when the protrusion 114 is formed. As a result, various defects, such as cracks, may be produced when the insulating layer structure 110 is subsequently planarized. If the width X of the protrusion 114 is increased to deviate from the range, a uniformity of the subsequent planarization process may be worse. In consideration of the above, the width X of the protrusion 114 may be properly controlled. The height Y of the protrusion 114 may be dependent on the height difference between the first and second pattern structures 102 and 104. Accordingly, as the height difference between the first and second pattern structures 102 and 104 increases, the height of the protrusion 114 may increase.

The protrusion 114 may have first and second side surfaces adjacent to the second and third portions B and C, respectively, and a top surface therebetween.

The first side surface of the protrusion 114 on the first region of the substrate 100 may have an average slope of less than about 90 degrees. A first horizontal distance D1 from a bottom edge of the first side surface of the protrusion 114 to a top edge thereof may be greater than about 0.

The second side surface of the protrusion 114 on the second region of the substrate 100 may have a staircase shape. The second side surface of the protrusion 114 may include at least two stair steps, i.e., first and second stair steps 12a and 12b. Each of the two stair steps 12a and 12b may have vertical and horizontal surfaces. The horizontal surface of the second stair step 12b may meet an edge of the top surface of the protrusion 114 at the area at which the first and second regions meet each other.

A second horizontal distance D2 from a bottom edge of the second side surface of the protrusion 114, i.e., from a bottom edge of the first stair step 12a to a bottom edge of the second stair step 12b may be longer than the first horizontal distance D1. Therefore, the second side surface of the protrusion 114 may have an average slope that is smaller than that of the first side surface.

A width of the horizontal surface and a height of the vertical surface of each of the stair steps 12a and 12b may vary in accordance with the number of stair steps of the second side surface of the protrusion 114. According as the number of the stair steps increases, the width of the horizontal surface and the height of the vertical surface of each stair may decrease.

When a layer is partially etched to form a pattern having a sidewall and a bottom, an etching gas may be concentrated on a portion of the pattern at which the sidewall and the bottom contact each other, which may be referred to as a bending portion thereof, and thus a microtrench may be generated near the bending portion. A size of the microtrench may become larger in accordance with a height of the pattern.

In example embodiments, however, the second side surface of the protrusion 114 has a staircase shape, and thus, each height of the stair steps, e.g., of the stair steps 12a and 12b is smaller than the total height Y of the protrusion 114. Therefore, microtrench formation may be reduced, and/or the size of microtrenches formed in the protrusion may be small. Accordingly, when the insulating layer structure 110 is planarized subsequently, by e.g., a polishing process, the generation of cracks may be reduced.

Additionally, the second side surface of the protrusion 114 of the insulating layer structure 110, as a whole, may have an average slope that is smaller than that of the first side surface thereof. Therefore, even if a strong stress is applied to the insulating layer structure 110 during the polishing process, the stress may be distributed rather than being focused to a certain portion. Thus, the protrusion 114 may not be broken due to the stress during the polishing process.

As explained above, the insulating layer structure 110 included in the semiconductor device according to example embodiments may be suitable for a polishing process.

FIGS. 2 to 7 are cross-sectional views illustrating stages of methods of manufacturing the semiconductor device shown in FIG. 1 in accordance with example embodiments.

Figure 2:
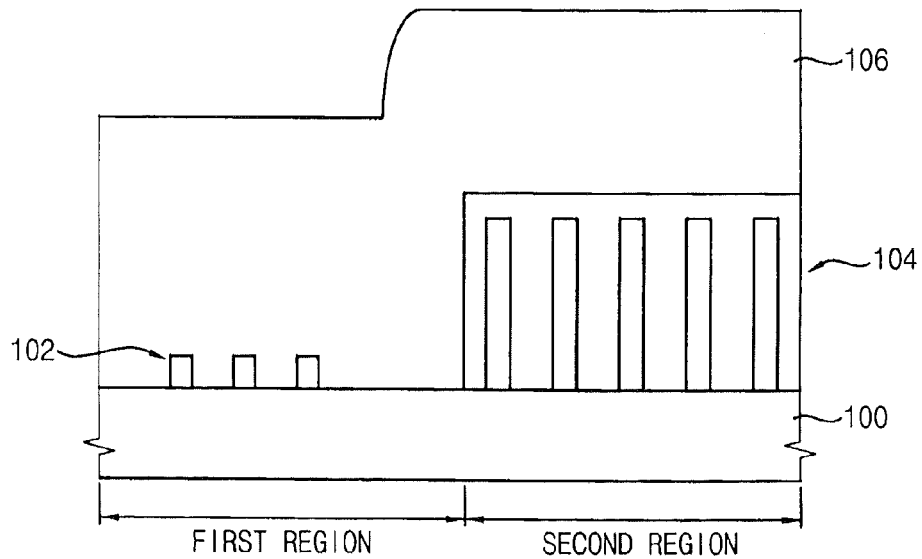

Referring to FIG. 2, a substrate 100 including a first region and a second region may be prepared. At least one first pattern structure 102 may be formed on the first region of the substrate 100. At least one second pattern structure 104 may be formed on the second region of the substrate 100. A top surface of the second pattern structure 104 may be higher than the top surface of the first pattern structure 102. Therefore, there is a height difference between the first and second pattern structures 102 and 104.

A first insulating layer 106 may be formed on the substrate 100, and cover the first and second pattern structures 102 and 104. The first insulating layer 106 may include e.g., silicon oxide. The first insulating layer 106 may be formed by a chemical vapor deposition (CVD) process. The first insulating layer 106 may have an upper surface of which a height may change according to a position thereof. That is, a height of a first upper surface of the first insulating layer 106 covering the first pattern 102 may be lower than that of a second upper surface of the first insulating layer 106 covering the second pattern structure 104. A first side surface may be formed between the first and second upper surfaces of the first insulating layer 106 near an area at which the first region and the second region meet each other. The first side surface may have an average slope that is less than about 90 degrees.

Except for the first side surface, the first and second upper surfaces of the first insulating layer 106 may be generally flat.

The first upper surface of the first insulating layer 106 may have a height that is greater than the top surface of the second pattern structure 104.

Figure 3:
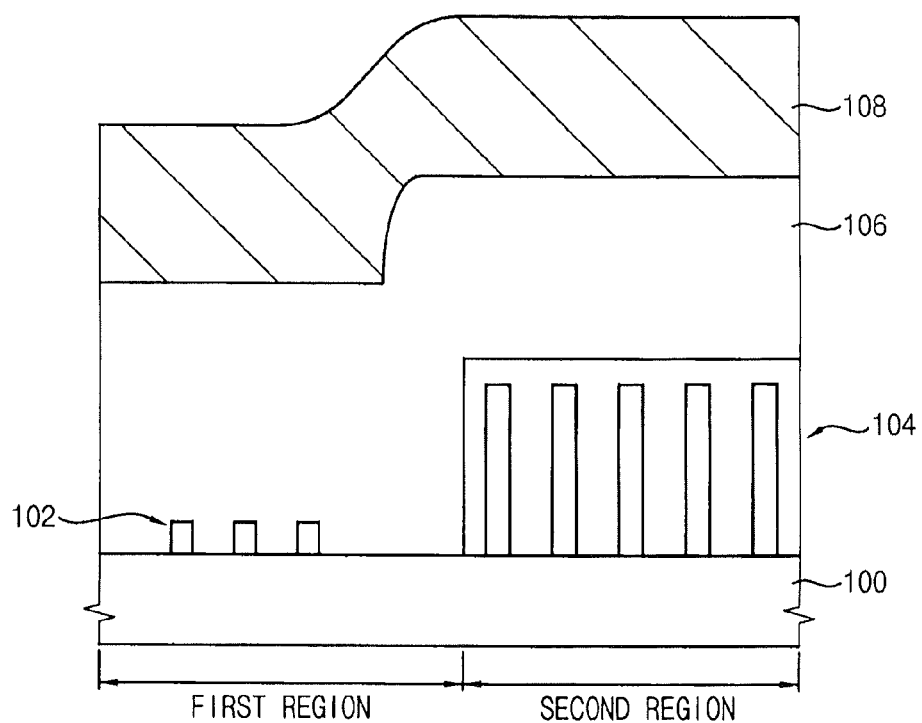

Referring to FIG. 3, a photoresist layer 108 may be formed on the first insulating layer 106.

A thickness of the photoresist layer 108 may be varied according to an amount of thickness of the photoresist layer 108 that may be trimmed and an amount of depth of the first insulating layer 106 that may be etched in subsequent processes.

Figure 4:
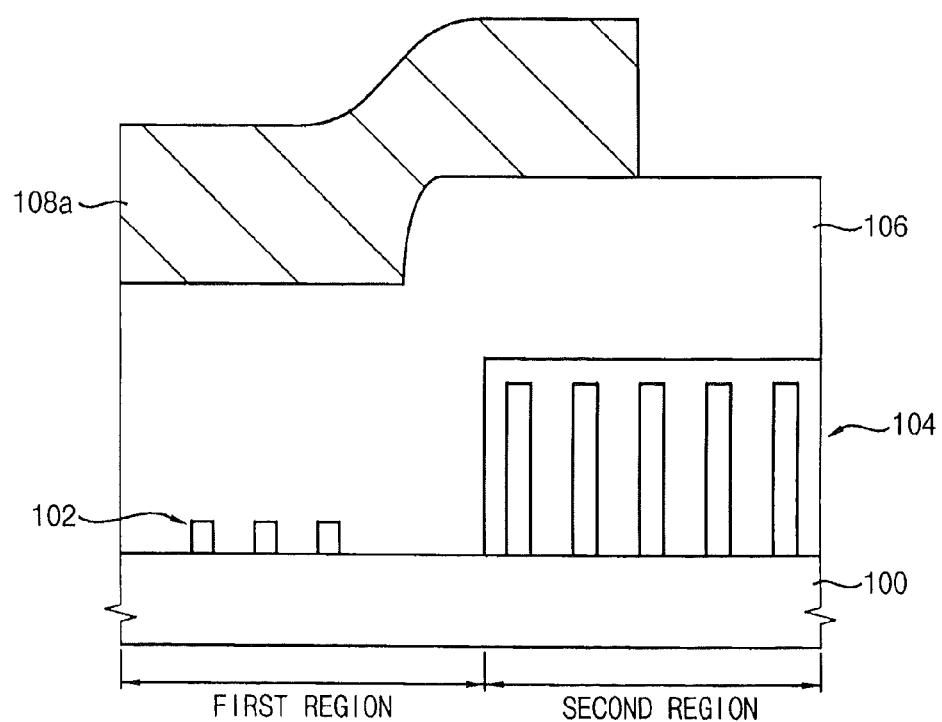

Referring to FIG. 4, the photoresist layer 108 may be patterned to form a first photoresist pattern 108a exposing a portion of the first insulating layer 106 in the second region of the substrate 100. The photoresist pattern 108a may cover the first upper surface, the first side surface and a portion of the second upper surface of the first insulating layer 106 adjacent to the first side surface thereof.

The height difference between the first and second upper surfaces of the first insulating layer 106 may define a height Y of a protrusion 114 (refer to FIG. 1) subsequently formed. A horizontal distance from a bottom edge of the first side surface of the first insulating layer 106 to an end portion of the first photoresist pattern 108a may define a width X of the protrusion 114. Therefore, a portion of the first insulating layer 106 covered by the first photoresist pattern 108a may be controlled so that a ratio of the height Y with respect to the width X of the protrusion 114 may be equal to or less than about ½, preferably, in a range of about 1/10 to about ½.

Figure 5:
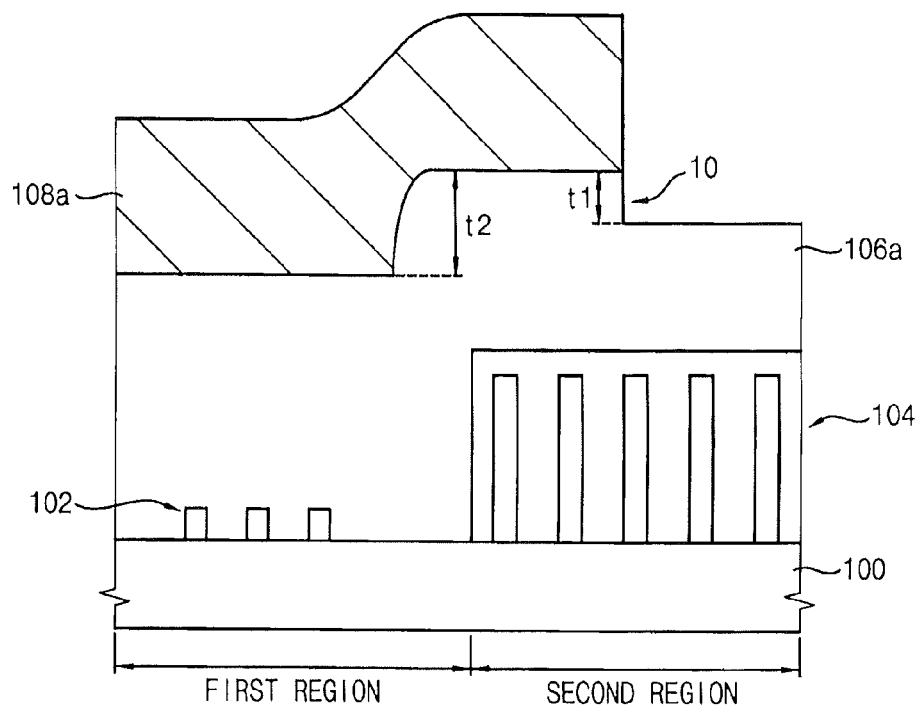

Referring to FIG. 5, the exposed portion of the first insulating layer 106 may be partially removed by a first etch process to form a second insulating layer 106a using the photoresist pattern 108a as an etch mask. The second insulating layer 106a may be formed to include a preliminary stair step 10.

In example embodiments, an amount of depth t1 of the first insulating layer 106 etched in the first etch process may be smaller than the height difference t2 between the first and second upper surfaces of the first insulating layer 106. Thus, a time required for the first etch process may be less than a time required for etching the first insulating layer 106 so that the second insulating layer 106a may have an upper surface substantially coplanar with the first upper surface of the first insulating layer 106. Accordingly, a microtrench that may be generated at a bending portion of the second insulating layer 106a during the etching process may be prevented and/or reduced.

Figure 6:
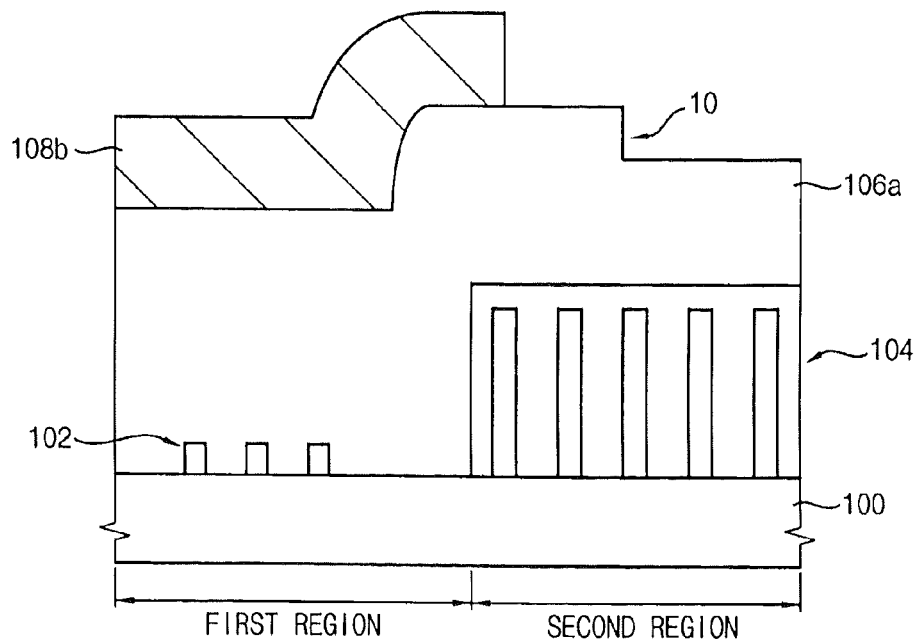

Referring to FIG. 6, the first photoresist pattern 108a may be trimmed or recessed to form a second photoresist pattern 108b. That is, an end potion of the first photoresist pattern 108a in the second region of the substrate 100 may be removed to form the second photoresist pattern 108b so that a portion of the second insulating layer 106a previously covered by the first photoresist pattern 108a may be exposed.

An edge of the second photoresist pattern 108b may be formed to be located in the second region of the substrate 100.

Figure 7:
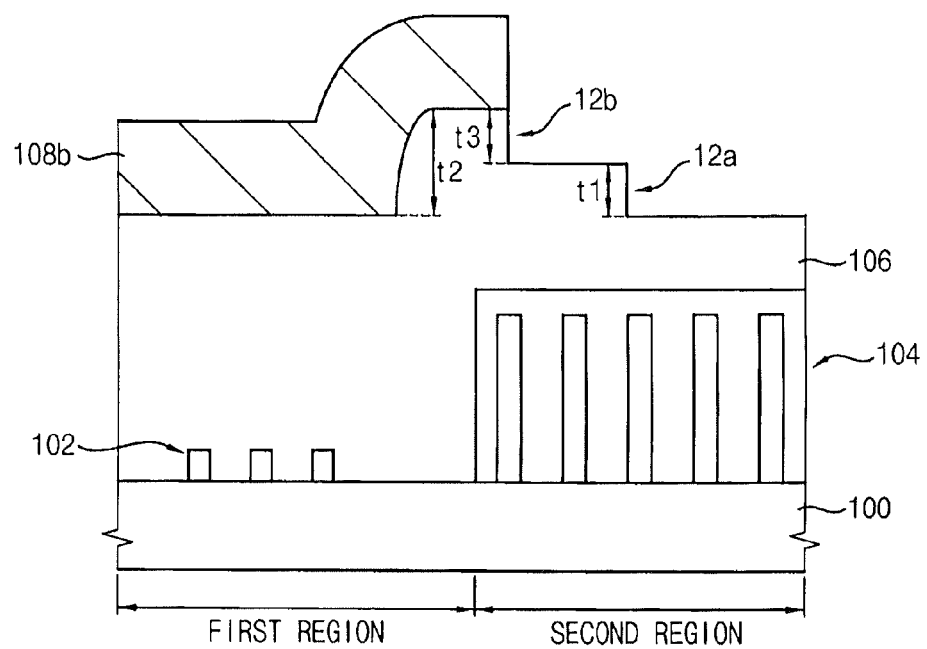

Referring to FIG. 7, the exposed portion of the second insulating layer 106a may be partially removed by a second etch process using the second photoresist pattern 108b as an etch mask to form an insulating layer structure 110 including the protrusion 114 near an area at which the first and second regions meet each other. The protrusion 114 may have a first side surface in the first region, a second side surface in the second region, and a top surface therebetween. The second side surface of the protrusion 114 may include two stair steps 12a and 12b.

An amount of depth t3 of the second insulating layer 106a etched in the second etch process may be smaller than the height difference t2 between the first and second upper surfaces of the first insulating layer 106. Thus, a time required for the second etch process may be less than a time required for etching the first insulating layer 106 so that the second insulating layer 106a may have an upper surface substantially coplanar with the first upper surface of the first insulating layer 106. Accordingly, a microtrench that may be generated at a bending portion of the insulating layer structure 110 during the etching process may be prevented and/or reduced.

Referring to FIG. 1 again, the second photoresist pattern 108b may be removed.

The insulating layer structure 110 may be formed to have first and second upper surfaces 110a, 110b in the first and second regions, respectively, and the protrusion 114 therebetween. In example embodiments, the second upper surface 110b of the insulating layer structure 110 may be formed to be substantially coplanar with the first upper surface 110a thereof. Therefore, the protrusion 114 may protrude from the first and second upper surfaces 110a, 110b of the insulating layer structure 110.

The first side surface of the protrusion 114 in the first region of the substrate 100 may have an average slope that is less than about 90 degrees. A first horizontal distance D1 from a bottom edge of the first side surface of the protrusion 114 to a top edge thereof may be greater than about 0. The second side surface of the protrusion 114 in the second region of the substrate 100 may have a staircase shape. The second side surface of the protrusion 114 may include at least two stair steps, i.e., first and second stair steps 12a and 12b. Each of the two stair steps 12a and 12b may have vertical and horizontal surfaces. The horizontal surface of the second stair steps 12b may meet an edge of the top surface of the protrusion 114 at the area at which the first and second regions meet each other.

A second horizontal distance D2 from a bottom edge of the second side surface of the protrusion 114, i.e., from a bottom edge of the first stair step 12a to a bottom edge of the second stair step 12b may be longer than the first horizontal distance D1. Therefore, the second side surface of the protrusion 114 as a whole may have an average slope that is smaller than that of the first side surface.

The insulating layer structure 110 may be formed to include the protrusion 114 having the second side surface with a staircase shape. Thus, a microtrench may not be generated or less generated at the bending portion of the second side surface and the insulating layer structure 110 may be properly polished.

Additionally, the second side surface of the protrusion 114 of the insulating layer structure 110, as a whole, may have a gentle slope, and thus, even if a strong stress is applied to the insulating layer structure 110 during the polishing process, the stress may be distributed rather than being focused onto a certain portion. Thus, the protrusion 114 may not be broken due to the stress during the polishing process.

After forming the insulating layer structure 110, a chemical mechanical polishing (CMP) process may be performed on the insulating layer structure 110 to planarize an upper portion of the insulating layer structure 110. When the CMP process is performed, the protrusion may be easily removed so that an insulating interlayer (not shown) having a desired degree of flatness may be formed.

Figure 8:
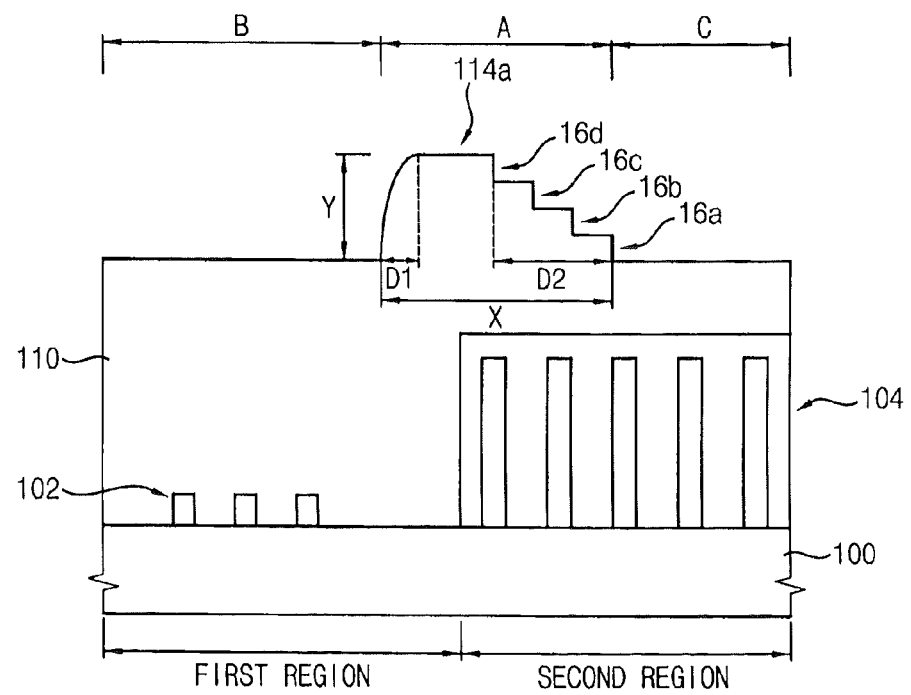

FIG. 8 is a cross-sectional view illustrating a semiconductor device in accordance with example embodiments.

The semiconductor for device shown in the FIG. 8 may be substantially the same as or similar to that illustrated with reference to FIG. 1 except for the number of stair steps of a protrusion.

Referring to FIG. 8, an insulating layer structure 110 may cover first and second pattern structures 102 and 104 on a substrate 100. The insulating layer structure 110 may include first, second and third portions A, B and C, and the first portion A may protrude from the second and third portions B and C, that is, the first portion A of the insulating layer structure 110 may have a protrusion 114a protruding from upper surfaces of the second and third portions B and C.

A ratio of a height Y with respect to a width X of the protrusion 114a may be equal to or less than about ½, preferably, in a range of about 1/10 to about ½, The protrusion 114a may have first and second side surfaces adjacent to the second and third portions B and C, respectively, and a top surface therebetween.

The first side surface of the protrusion 114a on the first region of the substrate 100 may have an average slope of less than about 90 degrees. A first horizontal distance D1 from a bottom edge of the first side surface of the protrusion 114a to a top edge thereof may be greater than about 0.

The second side surface of the protrusion 114a on the second region of the substrate 100 may have a staircase shape. The second side surface of the protrusion 114a may include at least four stairs, i.e., first, second, third and fourth stairs 16a, 16b, 16c and 16d. Each of the four stairs 16a, 16b, 16c and 16d may have vertical and horizontal surfaces. The horizontal surface of the fourth stairs 16d may meet an edge of the top surface of the protrusion 114a at the area at which the first and second regions meet each other.

A second horizontal distance D2 from a bottom edge of the second side surface of the protrusion 114a, i.e., from a bottom edge of the first stair 16a to a bottom edge of the fourth stair 16d may be longer than the first horizontal distance D1. Therefore, the second side surface of the protrusion 114a as a whole may have an average slope that is smaller than that of the first side surface.

A width of the horizontal surface and a height of the vertical surface of each of the stair steps 16a, 16b, 16c and 16d may vary in accordance with the number of stairs of the second side surface of the protrusion 114a. Accordingly, as the number of stair steps increases, the width of the horizontal surface and the height of the vertical surface of each stair may decrease.

Figure 9:
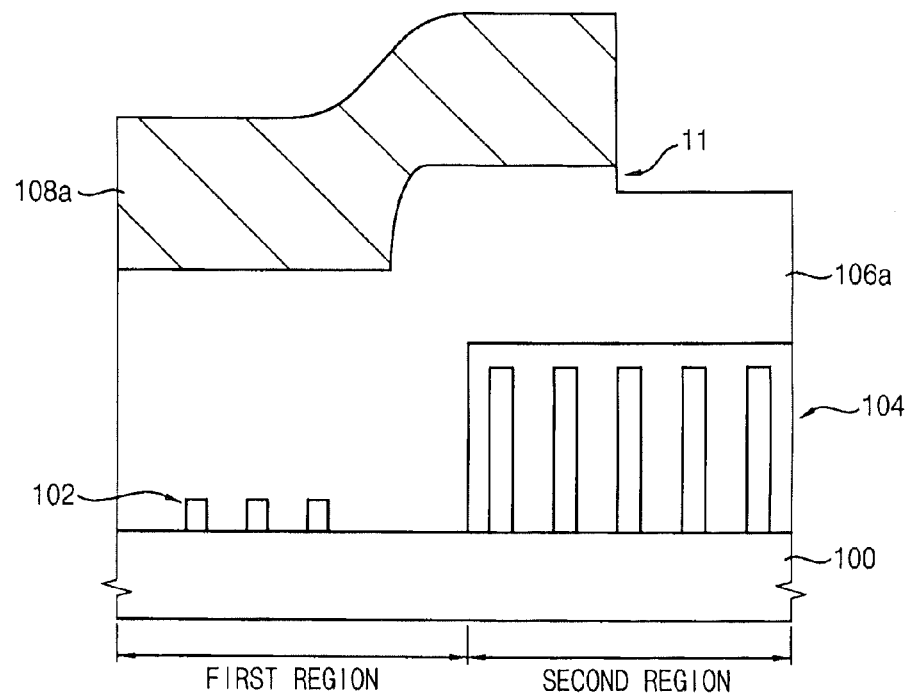
Figure 10:
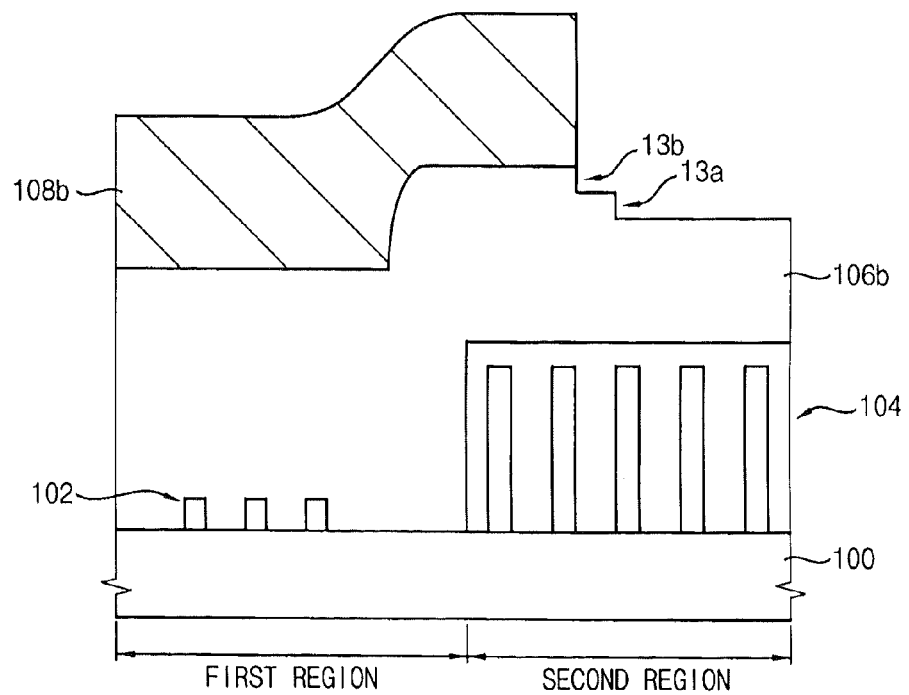
Figure 11:
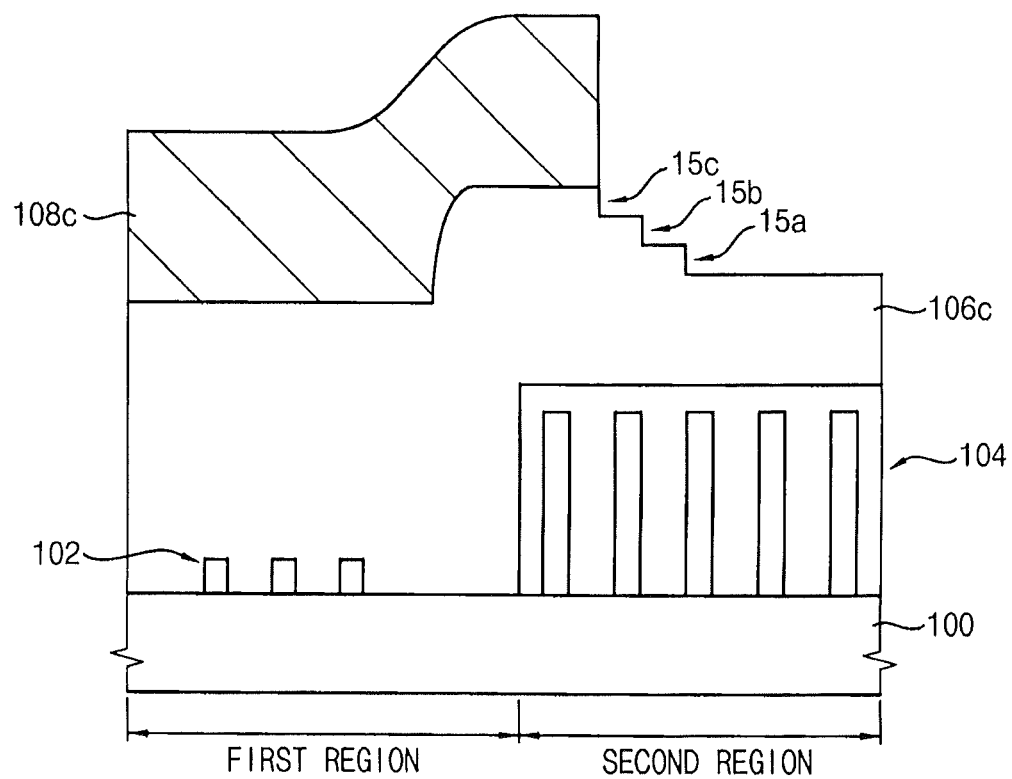

FIGS. 9 to 11 are cross-sectional views illustrating stages of methods of manufacturing the semiconductor device shown in FIG. 8 in accordance with example embodiments.

First, processes substantially the same as or similar to those illustrated with reference to FIGS. 2 to 4 may be performed.

Referring to FIG. 9, the exposed portion of the first insulating layer 106 may be partially removed by a first etch process to form a second insulating layer 106a using the photoresist pattern 108a as an etch mask. The second insulating layer 106a may be formed to include a preliminary stair 11.

In example embodiments, an amount of depth of the first insulating layer 106 etched in the first etch process may be smaller than the height difference between the first and second upper surfaces of the first insulating layer 106, and may be also smaller than the amount of depth of the first insulating layer 106 etched in the first etch process illustrated with reference to FIG. 5. Thus, a time required for the first etch process may be less than a time required for etching the first insulating layer 106 so that the second insulating layer 106a may have an upper surface substantially coplanar with the first upper surface of the first insulating layer 106, and may be also less than the time required for etching the first insulating layer 106 in the first etch process illustrated with reference to FIG. 5. Accordingly, a microtrench that may be generated at a bending portion of the second insulating layer 106a during the etching process may be prevented and/or reduced.

Referring to FIG. 10, the first photoresist pattern 108a may be trimmed or recessed to form a second photoresist pattern 108b. That is, an end potion of the first photoresist pattern 108a in the second region of the substrate 100 may be removed to form the second photoresist pattern 108b so that a portion of the second insulating layer 106a previously covered by the first photoresist pattern 108a may be exposed. In example embodiments, an amount of the end portion of the first photoresist pattern 108a trimmed may be less than the amount of the end portion of the first photoresist pattern 108a trimmed illustrated with reference to FIG. 6.

An edge of the second photoresist pattern 108b may be formed to be located in the second region of the substrate 100.

The exposed portion of the second insulating layer 106a may be partially removed by a second etch process using the second photoresist pattern 108b as an etch mask to form a third insulating layer structure 106b including preliminary stairs 13a and 13b.

Referring to FIG. 11, the second photoresist pattern 108b may be trimmed to form a third photoresist pattern 108c to expose a portion of the third insulating layer 106b previously covered by the second photoresist pattern 108b. The exposed portion of the third insulating layer 106b may be partially removed by a third etch process using the third photoresist pattern 108c as an etch mask to form a fourth insulating layer structure 106c including preliminary stair steps 15a, 15b and 15c.

By a process substantially the same as the above-illustrated process, the third photoresist pattern 108c may be trimmed to form a fourth photoresist pattern (not shown) to expose a portion of the fourth insulating layer 106c previously covered by the third photoresist pattern 108c. The exposed portion of the fourth insulating layer 106c may be partially removed by a fourth etch process using the fourth photoresist pattern as an etch mask to form the insulating layer structure 110 including the protrusion 114a in FIG. 8.

As illustrated above, the insulating layer structure 110 including the protrusion 114a having a plurality of stair steps at a second side surface may be formed by repeatedly performing a trimming process and an etching process.

After forming the insulating layer structure 110, a chemical mechanical polishing (CMP) process may be performed on the insulating layer structure 110 to planarize an upper portion of the insulating layer structure 110. When the CMP process is performed, the protrusion may be easily removed so that an insulating interlayer (not shown) having an obtainable degree of flatness may be formed.

Figure 12:
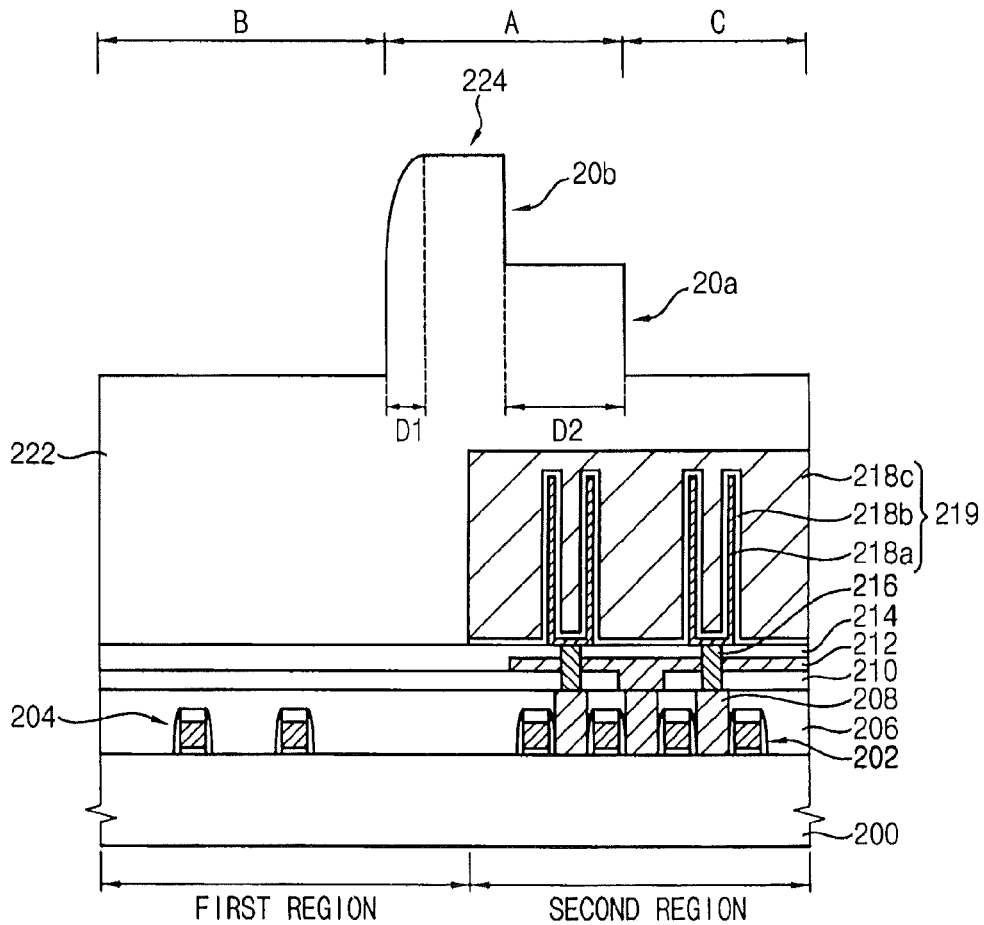

FIG. 12 is a cross-sectional view illustrating a semiconductor device in accordance with example embodiments. The semiconductor device may be a dynamic random access memory (DRAM) device.

Referring to FIG. 12, a substrate 200 may include a first region and a second region. The first region may serve as a peripheral region, and the second region may serve as a cell region of the semiconductor device.

Peripheral circuits may be formed on the first region of the substrate 200, and elements of a memory cell array may be formed on the second region of the substrate 200.

In example embodiments, cell transistors 202 may be formed in the second region, and peripheral circuit transistors 204 may be formed in the first region.

A first insulating interlayer 206 covering the cell transistors 202 and the peripheral circuit transistors 204 may be formed on the substrate 100. Contact plugs 208 may be formed through the first insulating interlayer 206, and may be electrically connected to source/drains (not shown) of the cell transistors 202. A second insulating interlayer 210 may be formed on the first insulating interlayer 206. A bit line structure 212 including a bit line and a bit line contact may be formed on and through the second insulating interlayer 210, and the bit line structure 212 may be electrically connected to some of the contact plugs 208. A third insulating interlayer 214 covering the bit line structure 212 may be formed on the second insulating interlayer 210. Storage node contacts 216 may be formed through the second and third insulating interlayers 210 and 214, and may be electrically connected to some of the contact plugs 208. Capacitors 219 may be formed on the storage node contacts 216, respectively. Each capacitor 219 may include a lower electrode 218a, a dielectric layer 218b, and an upper electrode 218c sequentially stacked.

The lower electrode 218a may have a cylindrical shape of which a height may be high so that the capacitor 219 may have a high capacitance. The capacitor 219 may be formed only in the second region, and thus there may be a height difference between the first and second regions.

An insulating layer structure 222 covering capacitors 219 may be formed on the third insulating interlayer 214. An upper surface of the insulating layer structure 222 may be higher than a top surface of the capacitors 219.

The insulating layer structure 222 may have a shape substantially the same as that of the insulating interlayer 110 of FIG. 1. The insulating layer structure 222 may include first, second and third portions A, B and C, and the first portion A may protrude from the second and third portions B and C, that is, the first portion A of the insulating layer structure 222 may have a protrusion 224 protruding from upper surfaces of the second and third portions B and C. The upper surfaces of the second and third portions B and C of the insulating layer structure 222 may be flat. In example embodiments, the upper surfaces of the second and third portions B and C of the insulating layer structure 222 may be substantially coplanar with each other.

The protrusion 224 may have first and second side surfaces adjacent to the second and third portions B and C, respectively, and a top surface therebetween.

The first side surface of the protrusion 224 on the first region of the substrate 200 may have an average slope less than 90 degrees. A first horizontal distance D1 from a bottom edge of the first side surface of the protrusion 224 to a top edge thereof may be greater than about 0.

The second side surface of the protrusion 224 on the second region of the substrate 200 may have a staircase shape. The second side surface of the protrusion 224 may include at least two stair steps, i.e., first and second stair steps 20a and 20b. Each of the two stair steps 20a and 20b may have vertical and horizontal surfaces. The horizontal surface of the second stair steps 20b may meet an edge of the top surface of the protrusion 224 at the area at which the first and second regions meet each other.

A second horizontal distance D2 from a bottom edge of the second side surface of the protrusion 224, i.e., from a bottom edge of the first stair 20a to a bottom edge of the fourth stair step 20b may be longer than the first horizontal distance D1. Therefore, the second side surface of the protrusion 224 as a whole may have an average slope that is smaller than that of the first side surface.

A width of the horizontal surface and a height of the vertical surface of each of the stair steps 20a and 20b may vary in accordance with the number of stair steps of the second side surface of the protrusion 224. Accordingly, as the number of the stair steps increases, the width of the horizontal surface and the height of the vertical surface of each stair step may decrease.

The insulating layer structure 222 included in the semiconductor device according to example embodiments may be suitable for the polishing process. Therefore, a planarized insulating interlayer may be formed without a damage to the infrastructure by using the insulating layer structure 222 in accordance with example embodiments.

Figure 13:
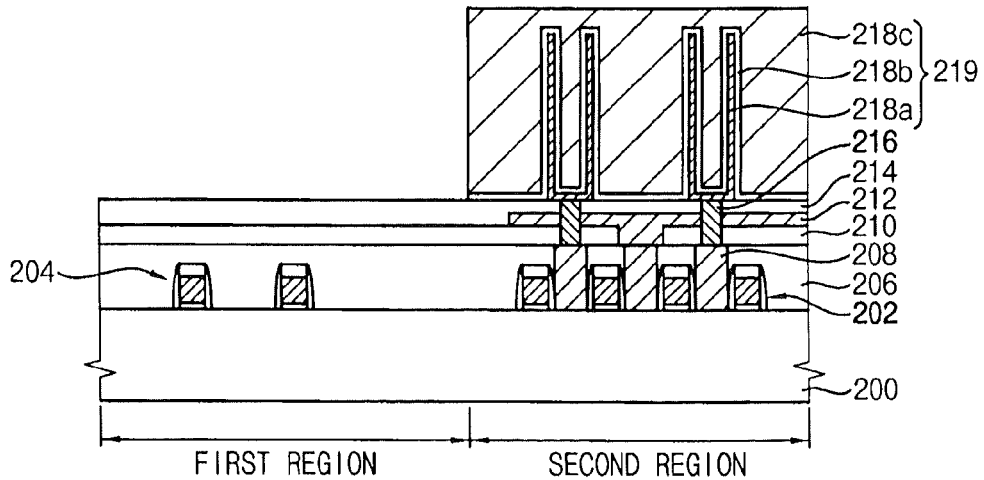
Figure 14:
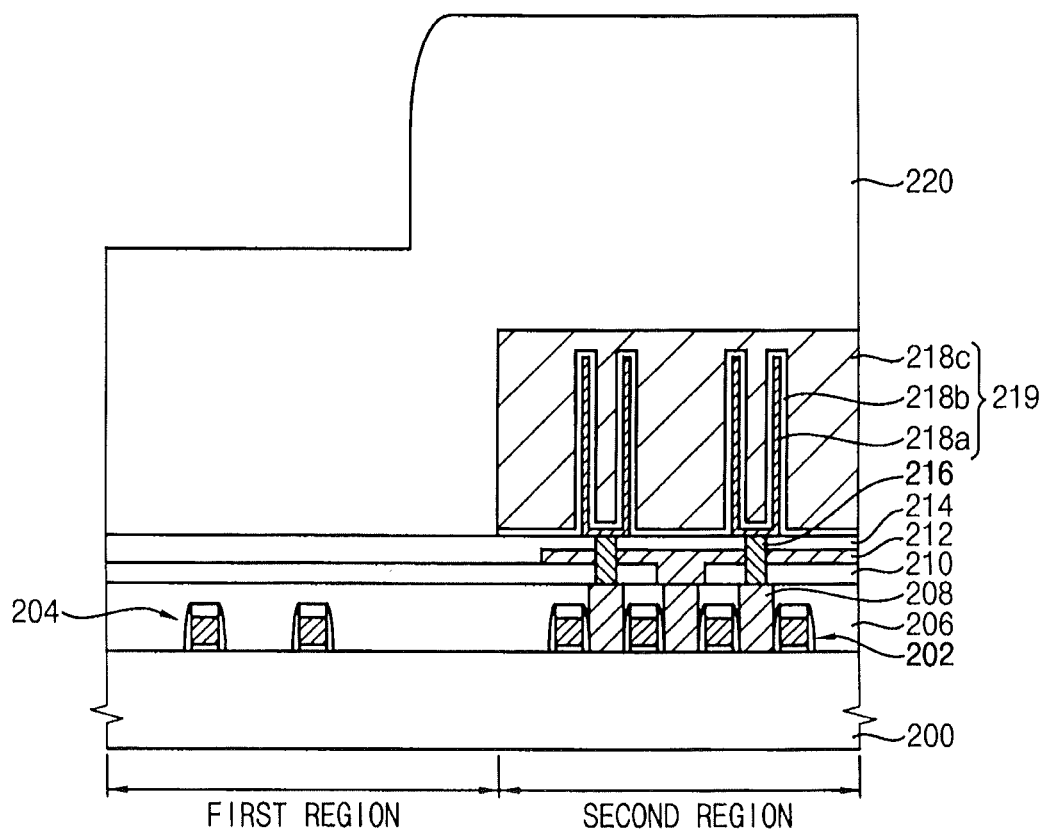

FIGS. 13 and 14 are cross-sectional views illustrating methods of manufacturing the semiconductor device shown in FIG. 12 in accordance with example embodiments.

Referring to FIG. 13, a substrate 200 including a first region and a second region may be prepared. Cell transistors 202 and peripheral circuit transistors 204 may be formed in the first and second regions, respectively.

A first insulating interlayer 206 may be formed on the substrate 200 to cover the transistors 202 and 204. Contact plugs 208 may be formed through the first insulating interlayer 206 to be electrically connected to source/drains (not shown) of the cell transistors 202.

A second insulating interlayer 210 may be formed on the first insulating interlayer 206 and the contact plugs 208. A bit line structure 212 may be formed on and through the second insulating interlayer 210 to be electrically connected to some of the contact plugs 208. A third insulating interlayer 214 covering the bit line structure 212 may be formed on the second insulating interlayer 210. Storage node contacts 216 may be formed through the second and third insulating interlayers 210 and 214 to be electrically connected to some of the contact plugs 208. Capacitors 219 may be formed on the storage node contacts 216, respectively.

Each capacitor 219 may be formed to include a lower electrode 218a, a dielectric layer 218b and an upper electrode 218c. The capacitors 219 may be formed only in the second region, and thus there may be a height difference between the first and second regions.

Referring to FIG. 14, a first insulating layer 220 covering the capacitors 219 may be formed on the third insulating interlayer 214. The first insulating layer 220 may be formed to have an upper surface of which a height may change according to a position thereof. That is, a height of a first upper surface of the first insulating layer 220 on the first region may be lower than the height of a second upper surface of the first insulating layer 220 covering the capacitors 219 on the second region.

A first side surface may be formed between the first and second upper surfaces of the first insulating layer 220 near an area at which the first region and the second region meet each other. The first side surface may have an average slope less than about 90 degrees.

Except for the first side surface, the first and second upper surfaces of the first insulating layer 220 may be flat.

The first upper surface of the first insulating layer 220 may be formed to have the height that is greater than the top surface of the pattern structure 219.

Processes substantially the same as or similar to those illustrated with reference to FIGS. 3 to 7 may be performed to form an insulating layer structure 222 including a protrusion 224 (refer to FIG. 12).

The insulating layer structure 222 may be formed to have first and second upper surfaces in the first and second regions, respectively, and the protrusion 224 therebetween. In example embodiments, the second upper surface of the insulating layer structure 222 may be formed to be substantially coplanar with the first upper surface thereof. Therefore, the protrusion 224 may protrude from the first and second upper surfaces of the insulating layer structure 222.

The first side surface of the protrusion 224 in the first region of the substrate 200 may have an average slope less than about 90 degrees. A first horizontal distance D1 from a bottom edge of the first side surface of the protrusion 224 to a top edge thereof may be greater than about 0. The second side surface of the protrusion 224 in the second region of the substrate 200 may have a staircase shape. The second side surface of the protrusion 224 may include at least two stairs, i.e., first and second stairs 20a and 20b. Each of the two stairs 20a and 20b may have vertical and horizontal surfaces. The horizontal surface of the second stairs 20b may meet an edge of the top surface of the protrusion 224 at the area at which the first and second regions meet each other.

A second horizontal distance D2 from a bottom edge of the second side surface of the protrusion 224, i.e., from a bottom edge of the first stair 20a to a bottom edge of the second stair 20b may be longer than the first horizontal distance D1. Therefore, the second side surface of the protrusion 224 as a whole may have an average slope that is smaller than that of the first side surface.

The insulating layer structure 220 may be formed to include the protrusion 224 having the second side surface of a stair shape. Thus, a microtrench may not be generated or less generated at the bending portion of the second side surface and the insulating layer structure 222 may be properly polished.

Additionally, the second side surface of the protrusion 224 of the insulating layer structure 222, as a whole, may have a gentle slope, and thus, even if a strong stress may be applied to the insulating layer structure 222 during the polishing process, the stress may be distributed rather than being focused to a certain portion. Thus, the protrusion 224 may not be broken due to the stress during the polishing process.

After forming the insulating layer structure 222, a chemical mechanical polishing (CMP) process may be performed on the insulating layer structure 222 to planarize an upper portion of the insulating layer structure 222 When the CMP process is performed, the protrusion 224 may be easily removed so that an insulating interlayer (not shown) having a desired degree of flatness may be formed.

Figure 15:
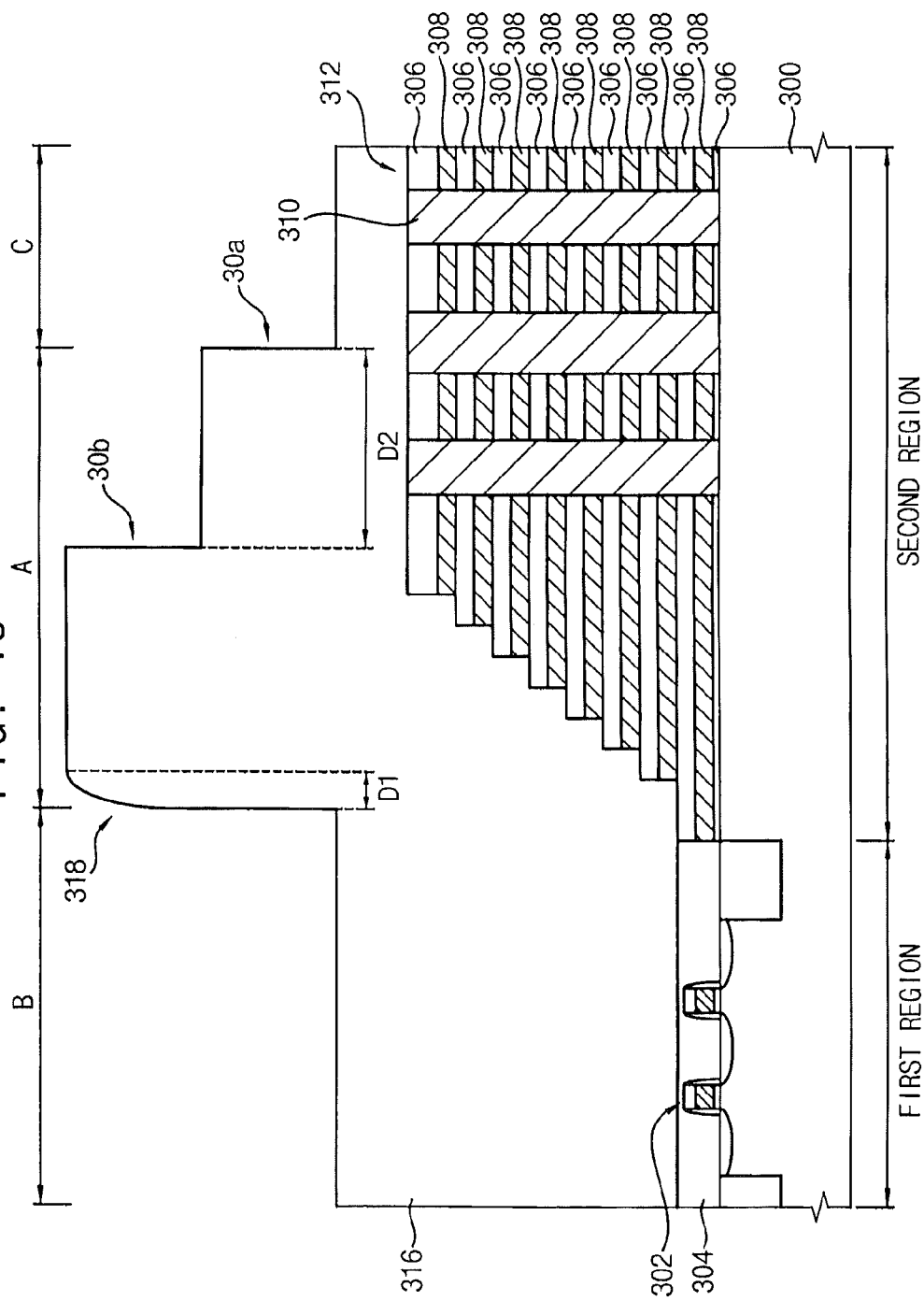

FIG. 15 is a cross-sectional view illustrating a semiconductor device in accordance with example embodiments. The semiconductor device may be a vertical non-volatile memory device.

Referring to FIG. 15, a substrate 300 may include a first region and a second region. The first region may serve as a peripheral region, and the second region may serve as a cell region of the semiconductor device.

Peripheral circuits may be formed on the first region of the substrate 300, and elements of a memory cell array may be formed on the second region of the substrate 300.

In example embodiments, a plurality of channel structures 310, each of which may extend in a vertical direction, may be formed on the second region of the substrate 300 to form a channel array. A plurality of gate structures 308, each of which may extend in a horizontal direction and surround the channel structures 310 may be formed in the vertical direction. The gate structures 308 disposed in the vertical direction may be spaced apart from each other by insulating interlayers 306. Therefore, the insulating interlayer 306 and the gate structure 308 may be alternately and repeatedly stacked in the vertical direction. The channel structures 310, the gate structures 308 and the insulating interlayers 306 may be referred to as a cell structure 312.

Horizontal lengths of the gate structures 308 may increase from an uppermost one toward a lowermost one of the gate structures 308. Therefore, the stacked gate structures 308 may have a staircase shape.

Peripheral transistors 302 may be formed in the first region, and may be planar transistors. The cell transistors 312 may not be formed in the first region. Thus, there may be a height difference between the first and second regions.

An insulating layer structure 316 covering the cell structure 312 may be formed on the first and second regions of the substrate 300. A height of an upper surface of the insulating layer structure 316 may be higher than that of a top surface of the cell structure 312

The insulating layer structure 316 may have a shape substantially the same as that of the insulating interlayer 110 of FIG. 1.

A portion of the insulating layer structure 316 near an area at which the first and second regions meet each other may be referred to as a first portion A. That is, the first portion A of the insulating layer structure 316 may be adjacent to both edges of the first and second regions that meet each other. A portion of the insulating layer structure 316 on the first region of the substrate 300 except for the first portion A may be referred to as a second portion B, and a portion of the insulating layer structure 316 on the second region of the substrate 316 except for the first region A may be referred to as a third portion C. Thus, the first portion A may be interposed between the second and third portions B and C.

Upper surfaces of the second and third portions B and C of the insulating layer structure 316 may be flat. In example embodiments, the upper surfaces of the second and third portions B and C of the insulating layer structure 316 may be substantially coplanar with each other.

The first portion A may protrude from the second and third portions B and C, that is, the first portion A of the insulating layer structure 316 may have a protrusion 318 protruding from the upper surfaces of the second and third portions B and C.

The protrusion 318 may have first and second side surfaces adjacent to the second and third portions B and C, respectively, and a top surface therebetween.

The first side surface of the protrusion 318 on the first region of the substrate 300 may have an average slope less than about 90 degrees. A first horizontal distance D1 from a bottom edge of the first side surface of the protrusion 318 to a top edge thereof may be greater than about 0.

The second side surface of the protrusion 318 on the second region of the substrate 300 may have a staircase shape. The second side surface of the protrusion 318 may include at least two stair steps, i.e., first and second stairs 30a and 30b. Each of the two stair steps 30a and 30b may have vertical and horizontal surfaces. The horizontal surface of the second stair steps 30b may meet an edge of the top surface of the protrusion 318 at the area at which the first and second regions meet each other.

A second horizontal distance D2 from a bottom edge of the second side surface of the protrusion 318, i.e., from a bottom edge of the first stair 30a to a bottom edge of the second stair 30b may be longer than the first horizontal distance D1. Therefore, the second side surface of the protrusion 318 as a whole may have an average slope that is smaller than that of the first side surface.

The insulating layer structure 316 included in the semiconductor device according to example embodiments may be suitable for the polishing process. Therefore, a planarized insulating interlayer may be formed without a damage of the infrastructure by using the insulating interlayer.

Figure 16:
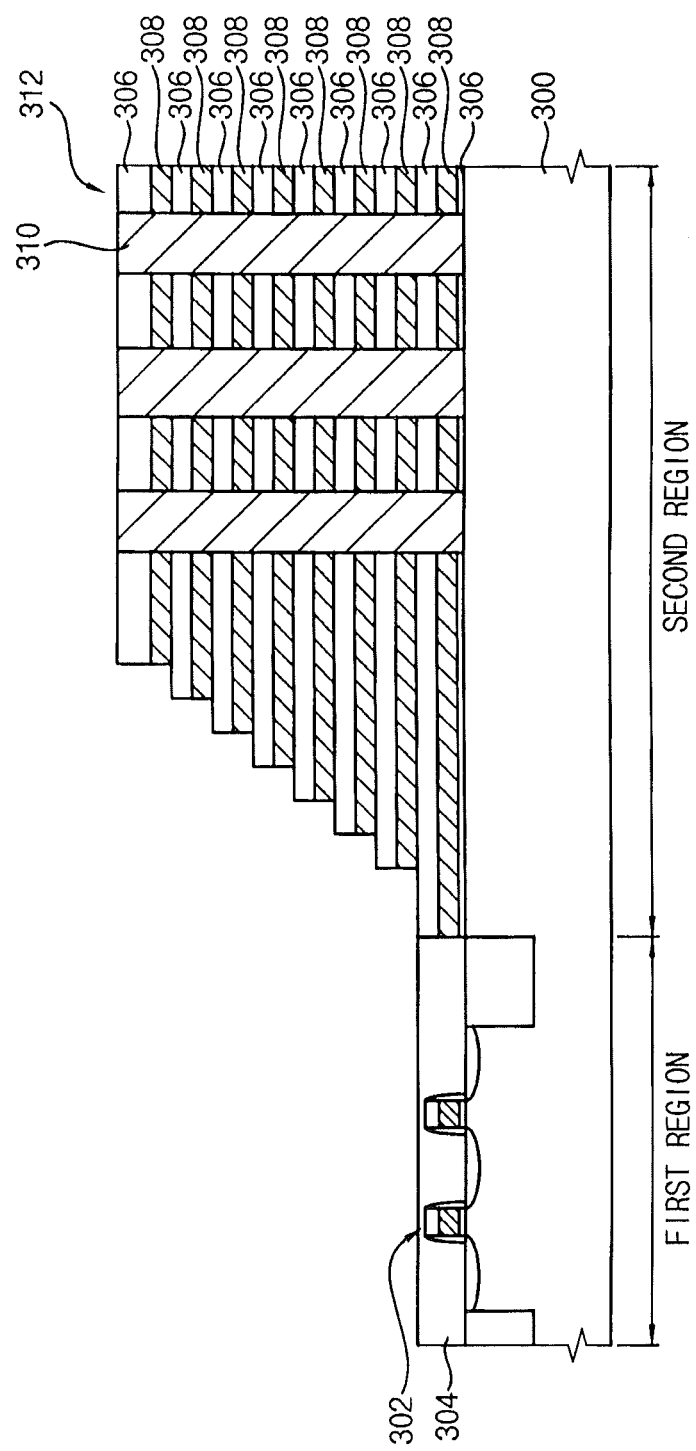

FIGS. 16 and 17 are cross-sectional views illustrating stages of a method of manufacturing a insulating layer structure of a semiconductor device shown in FIG. 15

Referring to FIG. 16, a substrate 300 including a first region and a second region may be prepared. Peripheral transistors 302 may be formed in the first region.

Channel structures 310 extending in a vertical direction and gate structures 308 extending in a horizontal direction and covering the channel structures 310 may be formed on the first and second regions of the substrate 300, respectively. The word line structures 308 may be sequentially formed and be separated from each other by insulating interlayers 306 in the vertical direction as same as the channel pillar structures 310. Likewise, a cell structure 312 including the channel pillar structures 310, the word line structures 308 and the insulating interlayers 306 may be formed on the second region of the substrate 300.

The stacked word line structures 308 may have a horizontal length becoming longer from an upper portion towards a lower portion. Therefore, an edge of the stacked word line structures 308 may have a staircase shape.

Referring to FIG. 17, a first insulating layer 314 covering the cell structure 312 may be formed on the substrate 300. The first insulating layer 314 may have an upper surface of which a height may change according to a position thereof. Capacitors may be formed only on the second region, and there may be a height difference between those, and thus, the first insulating layer 314 may have a height difference in accordance with the height difference between the first region and the second region.

In example embodiments, processes substantially the same as or similar to those illustrated with reference to FIGS. 3 to 7 may be performed to the first insulating layer 314. Therefore, as shown in the FIG. 15, an insulating layer structure 316 including a protrusion 318 may be formed. A second side surface of the protrusion 318 may have a staircase shape, and the second side surface of the protrusion 318 as a whole may have an average slope smaller than that of a first side surface. Therefore, the insulating layer structure 316 included in the semiconductor device according to example embodiments may be suitable for the polishing process.

The protrusion 318 may be easily removed by performing the subsequent CMP process and therefore, an insulating interlayer having a planarized shape of top surface may be formed. Therefore, the insulating interlayer may have an obtainable degree of flatness. As explained above, an insulating layer structure in accordance with example embodiments may be easily planarized by the CMP process. Therefore, the present inventive concept may be used for forming a various type of semiconductor devices having a high degree of height difference between pattern structures.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of forming a semiconductor device, comprising:
   forming a first pattern structure on a first region of a substrate;
   forming a second pattern structure on a second region of the substrate; the second pattern structure having a height that is greater than a height of the first pattern structure;
   forming a first insulating layer on the first and second pattern structures, an upper surface of the first insulating layer being higher than a top surface of the second pattern structure;
   forming a first photoresist pattern on the first insulating layer, the first photoresist pattern exposing a portion of the first insulating layer in the second region;
   partially etching the exposed portion of the first insulating layer using the first photoresist pattern as an etching mask to form a second insulation layer having a stair step;
   trimming an end portion of the first photoresist pattern in the second region to form a second photoresist pattern exposing a portion of the second insulating layer previously covered by the first photoresist pattern; and
   partially etching the exposed portion of the second insulating layer using the second photoresist pattern as an etching mask to form an insulating layer structure over an area at which the first and second regions meet each other, the insulating layer structure including a protrusion of which a side surface has a staircase shape.

2. The method of claim 1, wherein the insulating layer structure except for the protrusion is formed to have an upper surface that is substantially flat.

3. The method of claim 1, wherein a ratio of a height of the protrusion with respect to a width of the protrusion is in a range of about $1/10$ to about $1/2$.

4. The method of claim 1, wherein an edge of the second photoresist pattern is formed to be located in the second region.

5. The method of claim 1, after partially etching the exposed portion of the second insulating layer using the second photoresist pattern as the etching mask, further comprising:
   i) trimming an end portion of the second photoresist pattern in the second region to form a third photoresist pattern exposing a portion of the second insulating layer previously covered by the second photoresist pattern;
   ii) partially etching the exposed portion of the second insulating layer in the second region using the third photoresist pattern as an etching mask; and
   iii) performing steps i) and ii) at least once to form the insulating layer structure.

6. The method of claim 1, wherein the insulating layer structure includes silicon oxide.

7. The method of claim 1, after forming the insulating layer structure, further comprising performing a chemical mechanical polishing process to remove the protrusion from the insulating layer structure.

8. The method of claim 1, wherein the protrusion of the insulating layer structure includes first and second side surfaces adjacent to the first and second regions, respectively, and a first horizontal distance from a bottom edge of the first side surface of the protrusion to a top edge thereof is shorter than a second horizontal distance from a bottom edge of the second side surface to a top edge thereof.

9. A method of forming a semiconductor structure, comprising:
   providing a substrate including a first region and a second region;
   forming a first pattern structure on the first region of the substrate;

forming a second pattern structure on the second region of the substrate, the second pattern structure having a height that is greater than a height of the first pattern structure;

forming an insulating layer structure on the first and second pattern structures, wherein the insulating layer structure comprises a protrusion that protrudes from a surface of the insulating layer structure and that straddles an interface between the first region and the second region, wherein the protrusion has a first site surface in the first region and a second side surface in the second region, the second side surface having a staircase shape; and planarizing the insulating layer structure to remove the protrusion.

10. The method of claim 9, wherein the protrusion is formed to extend farther into the second region on the substrate than into the first region.

11. The method of claim 9, wherein a ratio of a height of the protrusion with respect to a width of the protrusion is in a range of about 1/10 to about 1/2.

12. The method of claim 9, wherein the first side surface of the protrusion has a larger average slope than the second side surface of the protrusion.

\* \* \* \* \*